(12) United States Patent
Otremba et al.

(10) Patent No.: US 9,748,166 B2
(45) Date of Patent: Aug. 29, 2017

(54) SEMICONDUCTOR DEVICES INCLUDING CONTROL AND LOAD LEADS OF OPPOSITE DIRECTIONS

(71) Applicant: Infineon Technologies Austria AG, Villach (AT)

(72) Inventors: Ralf Otremba, Kaufbeuren (DE); Klaus Schiess, Allensbach (DE)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 15/077,947

(22) Filed: Mar. 23, 2016

(65) Prior Publication Data

US 2016/0293528 A1 Oct. 6, 2016

(30) Foreign Application Priority Data

Mar. 31, 2015 (DE) .......... 10 2015 104 996

(51) Int. Cl.
*H01L 23/495* (2006.01)
*H01L 23/31* (2006.01)

(52) U.S. Cl.
CPC .. *H01L 23/49562* (2013.01); *H01L 23/49586* (2013.01); *H01L 23/3107* (2013.01); *H01L 23/49503* (2013.01); *H01L 23/49548* (2013.01); *H01L 23/49568* (2013.01); *H01L 2224/0603* (2013.01); *H01L 2224/48247* (2013.01); *H01L 2224/48257* (2013.01); *H01L 2224/49109* (2013.01); *H01L 2224/49111* (2013.01); *H01L 2924/181* (2013.01)

(58) Field of Classification Search
CPC .......... H01L 23/49562; H01L 23/3107; H01L 23/49586; H01L 23/49503; H01L 2224/0603
USPC ................................. 257/666, 676
See application file for complete search history.

(56) References Cited

U.S. PATENT DOCUMENTS

| | | | |
|---|---|---|---|
| 6,208,023 B1 * | 3/2001 | Nakayama | H01L 23/49503 257/666 |
| 6,313,598 B1 | 11/2001 | Tamba et al. | |
| 6,479,327 B2 * | 11/2002 | Takahashi | H01L 23/49562 257/67 |
| 6,624,522 B2 * | 9/2003 | Standing | H01L 23/3107 257/762 |
| 6,818,973 B1 * | 11/2004 | Foster | H01L 23/3107 257/668 |
| 2001/0040277 A1 * | 11/2001 | Lam | H01L 24/84 257/675 |
| 2007/0045785 A1 * | 3/2007 | Noquil | H01L 23/3107 257/666 |
| 2008/0315378 A1 | 12/2008 | Hata et al. | |
| 2009/0294936 A1 * | 12/2009 | Liu | H01L 23/49551 257/675 |

(Continued)

*Primary Examiner* — Nitin Parekh
(74) *Attorney, Agent, or Firm* — Dicke, Billig & Czaja, PLLC (57) ABSTRACT

A device includes a carrier and a semiconductor chip arranged over a surface of the carrier. The semiconductor chip includes a control electrode and a load electrode. A first lead is electrically coupled to the control electrode and extends away from the control electrode in a first direction. A second lead is electrically coupled to the load electrode and extends away from the load electrode in a second direction opposite the first direction.

26 Claims, 5 Drawing Sheets (56) References Cited

U.S. PATENT DOCUMENTS

| | | | |
|---|---|---|---|
| 2010/0181628 A1* | 7/2010 | Kawano | H01L 23/4952 257/401 |
| 2011/0049690 A1* | 3/2011 | Cho | H01L 21/4832 257/676 |
| 2012/0181676 A1* | 7/2012 | Tsui | H01L 23/49503 257/675 |
| 2014/0042599 A1* | 2/2014 | Wu | H01L 23/49575 257/666 |
| 2014/0117518 A1* | 5/2014 | Fernando | H01L 25/18 257/666 |
| 2015/0003019 A1* | 1/2015 | Ide | H05K 1/0271 361/705 |

* cited by examiner

SEMICONDUCTOR DEVICES INCLUDING CONTROL AND LOAD LEADS OF OPPOSITE DIRECTIONS

CROSS-REFERENCE TO RELATED APPLICATION

This Utility Patent Application claims priority to German Patent Application No. 10 2015 104 996.1, filed Mar. 31, 2015; and which is incorporated herein by reference.

TECHNICAL FIELD

The disclosure relates, in general, to semiconductor devices. More particular, the disclosure relates to devices including a semiconductor chip and multiple leads. The leads are coupled to control and load electrodes of the semiconductor chip and extend in opposite directions.

BACKGROUND

Semiconductor devices may include electronic components of arbitrary types. Electrical currents establishing a communication between the electronic components may generate unwanted effects such as e.g., parasitic inductances. These effects may have a bad impact on an operation and a performance of the semiconductor devices. Semiconductor devices constantly have to be improved. In particular, it may be desirable to reduce parasitic effects during an operation of the semiconductor devices. In addition, it may be desirable to improve a performance of the semiconductor devices.

BRIEF DESCRIPTION OF THE DRAWINGS

The accompanying drawings are included to provide a further understanding of aspects and are incorporated in and constitute a part of this specification. The drawings illustrate aspects and together with the description serve to explain principles of aspects. Other aspects and many of the intended advantages of aspects will be readily appreciated as they become better understood by reference to the following detailed description. The elements of the drawings are not necessarily to scale relative to each other. Like reference signs may designate corresponding similar parts.

DETAILED DESCRIPTION

In the following detailed description, reference is made to the accompanying drawings, in which are shown by way of illustration specific aspects in which the disclosure may be practiced. In this regard, directional terminology, such as "top", "bottom", "front", "back", etc. may be used with reference to the orientation of the figures being described. Since components of described devices may be positioned in a number of different orientations, the directional terminology may be used for purposes of illustration and is in no way limiting. Other aspects may be utilized and structural or logical changes may be made without departing from the concept of the present disclosure. Hence, the following detailed description is not to be taken in a limiting sense, and the concept of the present disclosure is defined by the appended claims.

As employed in this specification, the terms "connected", "coupled", "electrically connected" and/or "electrically coupled" may not necessarily mean that elements must be directly connected or coupled together. Intervening elements may be provided between the "connected", "coupled", "electrically connected" or "electrically coupled" elements.

Further, the word "over" used with regard to e.g., a material layer formed or located "over" a surface of an object may be used herein to mean that the material layer may be located (e.g., formed, deposited, etc.) "directly on", e.g., in direct contact with, the implied surface. The word "over" used with regard to e.g., a material layer formed or located "over" a surface may also be used herein to mean that the material layer may be located (e.g., formed, deposited, etc.) "indirectly on" the implied surface with e.g., one or more additional layers being arranged between the implied surface and the material layer.

Further, the words "perpendicular" and "parallel" may be used herein with regard to a relative orientation of two or more components. It is understood that these terms may not necessarily mean that the specified geometric relation is realized in a perfect geometric sense. Instead, fabrication tolerances of the involved components may need to be considered in this regard. For example, if two surfaces of an encapsulation material of a semiconductor package are specified to be perpendicular (or parallel) to each other, an actual angle between these surfaces may deviate from an exact value of 90 (or 0) degrees by a deviation value that may particularly depend on tolerances that may typically occur when applying techniques for fabricating a housing made of the encapsulation material.

Devices and methods for manufacturing devices are described herein. Comments made in connection with a described device may also hold true for a corresponding method and vice versa. For example, if a specific component of a device is described, a corresponding method for manufacturing the device may include an act of providing the component in a suitable manner, even if such act is not explicitly described or illustrated in the figures. In addition, the features of the various exemplary aspects described herein may be combined with each other, unless specifically noted otherwise.

The devices described herein may include one or more semiconductor chips that may be of different types and may be manufactured by different technologies. In general, the semiconductor chips may include integrated electrical, electrooptical or electromechanical circuits, passives, etc. In addition, the integrated circuits may generally be designed as logic integrated circuits, analog integrated circuits, mixed signal integrated circuits, power integrated circuits, memory circuits, integrated passives, microelectromechanical systems, etc.

The semiconductor chips need not be manufactured from a specific semiconductor material and may contain inorganic and/or organic materials that are not semiconductors, such as, for example, insulators, plastics, metals, etc. In one example, the semiconductor chips may be made of or may include an elemental semiconductor material, for example Si, etc. In a further example, the semiconductor chips may be made of or may include a compound semiconductor material, for example GaN, SiC, SiGe, GaAs, etc.

The semiconductor chips may include one or more power semiconductors. In general, power semiconductor chips may be configured as diodes, power MOSFETs (Metal Oxide Semiconductor Field Effect Transistors), IGBTs (Insulated Gate Bipolar Transistors), JFETs (Junction Gate Field Effect Transistors), HEMTs (High Electron Mobility Transistors), super junction devices, power bipolar transistors, etc. In particular, the power semiconductor chips may be based on one or more of the compound semiconductor materials specified above. Devices in accordance with the disclosure are not restricted to include one specific type of power semiconductor chip. Comments made in connection with a specific type of power semiconductor chip may thus be likewise applied to other types of power semiconductor chips.

The semiconductor chips may have a vertical structure, i.e. the semiconductor chips may be fabricated such that electrical currents may substantially flow in a direction perpendicular to the main faces of the semiconductor chips. A semiconductor chip having a vertical structure may have electrodes over its two main faces, i.e. over its top side and bottom side. In particular, power semiconductor chips may have a vertical structure and may have electrodes arranged over both main faces. In one example, the source electrode and gate electrode of a power MOSFET may be arranged over one face while the drain electrode of the power MOSFET may be arranged over the other face. In this regard, each of the drain electrode and the source electrode may represent an example of a load electrode while the gate electrode may represent an example of a control electrode. A contact area of a load electrode may particularly be greater than a contact area of a control electrode. In a further example, a power HEMT may be configured as a vertical power semiconductor chip. Yet further examples for vertical power semiconductor chips are a PMOS (P-Channel Metal Oxide semiconductor), an NMOS (N-Channel Metal Oxide semiconductor), or one of the exemplary power semiconductors specified above.

The semiconductor chips may have a lateral structure, i.e. the semiconductor chips may be fabricated such that electrical currents may substantially flow in a direction parallel to a main face of the semiconductor chips. A semiconductor chip having a lateral structure may have electrodes arranged over one of its main faces. In one example, a power semiconductor chip may have a lateral structure. For example, a gate electrode, a source electrode and a drain electrode of a power MOSFET may be arranged over one main face of a power MOSFET. A further example of a lateral power semiconductor chip may be a power HEMT that may be fabricated from one of the above mentioned compound semiconductor materials.

The devices described herein may include one or more control semiconductor chips (or control integrated circuits) configured to control or drive electronic components of the device. For example, a control semiconductor chip may be configured to control or drive the integrated circuits of one or more power semiconductor chips. In this regard, the terms "control semiconductor chip" and "driver semiconductor chip" may be used synonymously.

A driver circuit may be configured to drive one or more electronic components of the device, such as e.g., a high-power transistor. The driven components may be voltage driven or current driven. For example, Power MOSFETs, IGBTs, etc., may be voltage driven switches, because their insulated gate may particularly behave like a capacitor. Conversely, switches such as triacs (triode for alternating current), thyristors, bipolar transistors, a PN diode, etc., may be current driven. In one example, driving a component including a gate electrode may be performed by a gate driver circuit. The driving process may include applying different voltages to the gate electrode, for example in form of turn-on and turn-off switching wave forms. In a further example, a driver circuit may be used to drive a direct driven circuit. A control circuit may be configured to control one or more drivers that drive components of the device. In one example, a control circuit may simultaneously control drivers of multiple direct driven circuits. For example, a half bridge circuit including two direct driven circuits may thus be controlled by a controller. A controller may e.g., include a micro controller.

The semiconductor chips may include an arbitrary number of electrical contacts. An electrical contact may have the form of a contact pad (or a contact element or a contact terminal or a contact electrode) that may be fabricated of at least one of a metal and a metal alloy. Any desired metal or metal alloy, for example, aluminum, titanium, gold, silver, copper, palladium, platinum, nickel, chromium, vanadium, tungsten, molybdenum, etc., may be used as a material.

The semiconductor chips may be packaged or unpackaged. In this regard, the terms "semiconductor device" and "semiconductor package" may be interchangeably used. In particular, a semiconductor package may be a semiconductor device including an encapsulation material that may at least partly cover (or embed or encapsulate) one or more components of the semiconductor device. In one example, the components may be covered by only one type of encapsulation material. In further examples, the components may be covered by multiple encapsulation materials that may differ from each other. In particular, the encapsulation materials may differ with respect to at least one of their electrical conductivity, electromagnetic shielding capability, thermal conductivity, and mechanical hardness. In one example, a first encapsulation material may cover one or more components of a device, for example a semiconductor chip. In addition, a second encapsulation may cover the first encapsulation material, wherein the second encapsulation material may not necessarily be in direct contact with the components of the device covered by the first encapsulation material.

The encapsulation material may be electrically insulating and may form an encapsulation body. The encapsulation material may include at least one of an epoxy, a filled epoxy, a glass fiber filled epoxy, a glass fiber filled polymer, an imide, a filled or non-filled thermoplastic polymer material, a filled or non-filled duroplastic polymer material, a filled or non-filled polymer blend, a thermosetting material, a thermoplast material, a mold compound, a glob-top material, a laminate material, etc. Various techniques may be used to encapsulate components of the device with the encapsulation material, for example at least one of compression molding, injection molding, powder molding, liquid molding, lamination, etc.

A thermoplast material may include at least one of polyethylene, polyvinyl chloride, polystyrene, polyamide, polypropylene, etc. A filled epoxy may include filler particles which may have a diameter in a range from about 10 micrometer to about 100 micrometer. In one example, the filler particles may include a metal and/or a metal alloy, in particular at least one of Cu, Ni, Fe, Ag, Al, alloys of said metals, etc. Such filler particles may increase an electrical conductivity and an electromagnetic shielding capability of the filled epoxy. In a further example, the filler particles may include at least one of boron nitride, aluminum nitride, metals, etc. Such filler particles may increase a thermal conductivity of the filled epoxy. In yet a further example, the filler particles may include at least one of silicon nitride, silicon oxide, etc. Such filler particles may increase a mechanical hardness of the filled epoxy.

The devices described herein may include a carrier over which one or more components of the device may be arranged. In general, a carrier may be manufactured from at least one of a metal, an alloy, a dielectric, a plastic, a ceramic, etc. The carrier may have a homogeneous structure, but may also provide internal structures like conducting paths with an electrical redistribution function. For example, a carrier may include at least one of a diepad, a leadframe including a diepad, a ceramic substrate including one or more redistribution layers, etc.

A carrier may include one or more carrier sections. In one example, a carrier section may provide a mounting surface for mounting an electronic component of the device. In this regard, the carrier section may e.g., correspond to a diepad on which a semiconductor chip may be mounted. A level of the device including such carrier section may be referred to as diepad level. In a further example, a carrier section may include one or more electrically conductive terminals (or leads or pins) that may provide an electrical connection between components of the device and external components. In this regard, the carrier section may e.g., correspond to one or more leads of a leadframe. An electrical connection between a lead and a semiconductor chip of the device may be additionally established by an electrically conductive coupling element, for example at least one of a wire and a clip. A level of the device including such carrier section may be referred to as wirebond level.

The carrier sections of a carrier may be arranged on one or more levels that may differ from each other. A carrier having multiple carrier sections arranged on different levels may be referred to as multilevel carrier. In one example, each carrier section of a carrier may be arranged in a plane, wherein the different planes associated with the different carrier sections may be arranged in parallel to each other. For example, diepads of the device may be arranged at the diepad level, and electrical terminals or leads coupled to wirebonds may be arranged at the wirebond level. In a multilevel carrier, a distance between a first level and a different second level may lie in a range from about 0.5 millimeter to about 5.0 millimeter, or in any of the subranges included in this range.

The carrier sections of a carrier may at least partly be covered by an encapsulation material of the device. A carrier section may be completely surrounded by an encapsulation material such that there are no surfaces of the carrier section accessible from outside of the encapsulation material. A further carrier section may be at least partly exposed from an encapsulation material such that there may be one or more exposed surfaces. For example, a surface of a diepad may be exposed from an encapsulation material such that a heatsink may be arranged over the exposed surface. Thermal grease may be arranged between the exposed surface of the diepad and the heatsink. During an operation of a device, heat generated by e.g., a semiconductor chip may be dissipated along a path that may extend from the semiconductor chip to the heatsink. In one example, the diepad may include a hole extending through the diepad, wherein the hole may be exposed from the encapsulation material or not. The heatsink may be attached to the diepad by a fixing component, such as e.g., a screw, that may extend through the hole.

In one example, a carrier may include a leadframe that may be structured such that diepads and leads may be formed. During a fabrication of a device, the diepads and the leads may be connected to each other. The diepads and the leads may be made from one single piece. The diepads and the leads may be connected among each other by connection means with the purpose of separating some of the diepads and the leads in the course of the fabrication. Here, separating the diepads and the leads may be carried out by at least one of mechanical sawing, a laser beam, cutting, stamping, milling, etching, etc. In one example, the leadframe may be a multilevel leadframe having various sections arranged on different levels. For example, the different levels of the leadframe may be implemented by bending the leadframe in a suitable manner before or after the various carrier sections may have been formed.

A leadframe may be electrically conductive. For example, the leadframe may be entirely fabricated from metals and/or metal alloys, in particular at least one of copper, copper alloys, nickel, iron nickel, aluminum, aluminum alloys, steel, stainless steel, etc. The leadframe material may include traces of iron, sulfur, iron nitride, etc. The leadframe may be plated with an electrically conductive material, for example at least one of copper, silver, palladium, gold, nickel, iron nickel, nickel phosphorus, etc. In this case, the leadframe may be referred to as "pre-plated leadframe". Even though a leadframe may be electrically conductive, an arbitrary selection of diepads of the leadframe may be electrically insulated from each other.

The devices described herein may include one or more leads that may be a part of a leadframe. The leads may protrude out of an encapsulation material of the device such that an electrical connection between internal and external components may be established. A first lead (or a set of first leads) may protrude out of a first surface of the encapsulation material, wherein the first lead may be electrically coupled to a control electrode of a semiconductor chip and may extend away from the control electrode in a first direction. Such lead may be referred to as control lead or logic lead. A second lead (or a set of second leads) may protrude out of a second surface of the encapsulation material opposite the first surface. The second lead may be electrically coupled to a load electrode of the semiconductor chip and may extend away from the load electrode in a second direction opposite the first direction. Such lead may be referred to as load lead or power lead. The devices described herein may thus represent arrangements providing a directional separation of the control leads and the load leads connected to an included semiconductor chip.

A set of multiple leads protruding out of a same surface of an encapsulation material may be arranged in parallel. The distances between the individual leads may be similar or may differ from each other. In this regard, a distance between two leads may be referred to as lead pitch. In one example, a lead pitch $p_{low}$ between two leads used for low voltage or logic applications may lie in a range from about 1 millimeter to about 3 millimeter, and a lead pitch $p_{high}$ between two leads used for high voltage/high current applications may have a value of about $2 \times p_{low}$.

The devices described herein may include one or more leads that may provide one or more sensing signals. A sensing signal may be based on or may depend on a physical parameter (or physical quantity or physical magnitude) of an electronic component included in the considered device, for example an included semiconductor chip. The sensing signal may thus represent or may include information about a physical property of the electronic component that can be quantified by a measurement. In this regard, a sensing signal provided by the lead and the associated physical parameter may not necessarily coincide with regard to their physical units. For example, the sensing signal may correspond to a measured voltage, but may represent a different physical quantity, for example an electrical current or a temperature.

In one example, a sensing lead may provide a sensing signal that may be based on or may represent an electrical potential in or on a semiconductor chip or one of its components. The sensing signal may e.g., represent an electrical potential of an electrode of the semiconductor chip, for example a source electrode of a power HEMT. In a further example, a sensing lead may provide a sensing signal that may be based on an electrical current in or on a semiconductor chip. The lead providing the sensing signal may be electrically coupled to a shunt that may be used for measuring the electrical current. For example, the shunt may be integrated in the considered semiconductor chip or may be arranged external to the semiconductor chip. In yet a further example, a sensing lead may provide a sensing signal that may be based on a temperature in or on a semiconductor chip. The lead providing the sensing signal may be electrically coupled to a diode that may be used for measuring the temperature. The diode may be integrated in the considered semiconductor chip or may be arranged external to the semiconductor chip.

The devices described herein may include one or more electrically conductive elements configured to provide an electrical coupling between components of the devices. In one example, an electrically conductive element may be configured to electrically connect an electrode of a semiconductor chip and an electrode of another semiconductor chip. In a further example, an electrically conductive element may be configured to electrically connect an electrode of a semiconductor chip to a diepad or a lead of a leadframe.

An electrically conductive element may include one or more contact clips. A contact clip may be made of or may include a material similar to a leadframe. The contact clip may be fabricated by at least one of stamping, punching, pressing, cutting, sawing, milling, etc. A contact between the electrically conductive element and a contact pad of a semiconductor chip may be established by a diffusion soldering process in one example.

An electrically conductive element may include one or more wires, in particular bond wires. A wire may include a metal and/or a metal alloy, in particular gold, aluminum, copper, or one or more of their alloys. In addition, the wire may or may not include a coating. The wire may have a circular cross section such that the term "thickness" of the wire may refer to the diameter of the bond wire. For example, a thickness of a wire may depend on the strength of the currents passing through the wire. In a first example, the wire may have a thickness smaller than 75 micrometer, for example a thickness from about 50 micrometer to about 75 micrometer. Such wire may e.g., include or be made of aluminum. The wire may include further materials, for example up to 1% silicon. For example, such wire may provide an electrical connection between a contact element and a gate electrode of a power semiconductor chip and/or between gate electrodes of two different power semiconductor chips. In a second example, the wire may have a thickness from about 125 micrometer to about 500 micrometer. Such wire may provide an electrical connection between a contact element and a source electrode of a power semiconductor chip.

The devices described herein may include an insulation layer that may particularly be arranged over a surface of a carrier. A thickness of the insulation layer may lie in a range from about 50 micrometer to about 500 micrometer, or in any of the subranges included in this specified range. The insulation material may be formed by applying at least one of etching, UV curing, vapor deposition, spin-on techniques, printing, photolithographic structuring, etc.

The insulation layer may include a porous material. The porosity of a material may be regarded as a measure of the amount of empty spaces in the material, for example spaces filled with air. The porosity may be given as the percentage of the empty spaces with regard to the total volume of the insulation layer. In particular, the porosity of the insulation layer may be greater than 25%, more particular greater than 50%, and even more particular greater than 60%. The insulation layer may include at least one of silicon dioxide, fluorine-doped silicon dioxide, carbon-doped silicon dioxide, polymeric dielectric, nitride, metal oxide, etc.

The insulation layer may satisfy specific conditions with regard to its dielectric constant Er and its thermal conductivity $\lambda$. In one example, the dielectric constant Er of the insulation layer may be lower than 3.5, more particular lower than 3.0, more particular lower than 2.0, and even more particular lower than 1.5. In a further example, the dielectric constant $\in_r$ and the thermal conductivity $\lambda$ of the insulation layer may satisfy the relation $\lambda \cdot \in_r < 4.0 \ W \cdot m^{-1} \cdot K^{-1}$, more particular the relation $\lambda \cdot \in_r < 3.5 \ W \cdot m^{-1} \cdot K^{-1}$, more particular the relation $\lambda \cdot \in_r < 3.0 \ W \cdot m^{-1} \cdot K^{-1}$, more particular the relation $\lambda \cdot \in_r < 2.0 \ W \cdot m^{-1} \cdot K^{-1}$, and even more particular the relation $\lambda \cdot \in_r < 1.0 \ W \cdot m^{-1} \cdot K^{-1}$. In yet a further example, the thermal conductivity $\lambda$ of the insulation layer may be greater than $0.7 \ W \cdot m^{-1} \cdot K^{-1}$, more particular greater than $1.0 \ W \cdot m^{-1} \cdot K^{-1}$, and even more particular greater than $1.3 \ W \cdot m^{-1} \cdot K^{-1}$.

The devices described herein may include a motherboard (or mainboard or system board). The term motherboard may particularly refer to a printed circuit board (PCB) that may have expansion capability. The motherboard may include crucial electronic components of the considered system, for example a central processing unit (CPU), memory, multiple connectors, interfaces for peripherals, etc. The devices described herein may further include one or more daughterboards. The term daughterboard may refer to a circuit board that can be seen as an extension of a motherboard. A daughterboard may e.g., include plugs, sockets, pins, connectors, etc.

Figure 1:
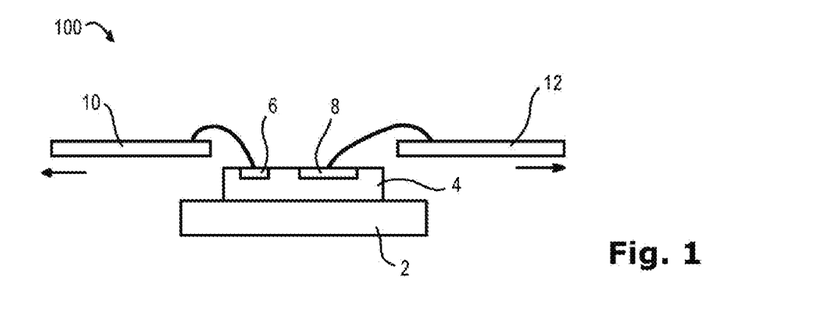
FIG. 1 schematically illustrates a cross-sectional side view of a device 100 in accordance with the disclosure.

FIG. 1 schematically illustrates a cross-sectional side view of a device 100 in accordance with the disclosure. In the example of FIG. 1, the device 100 is illustrated in a general manner and may include further components that are not illustrated for the sake of simplicity. For example, the device 100 may further include one or more components of other devices in accordance with the disclosure.

The device 100 may include a carrier 2 and a semiconductor chip 4 that may be arranged over a surface of the carrier 2. For example, the semiconductor chip 4 may be based on a compound semiconductor material. In a more specific example, the semiconductor chip 4 may e.g., correspond to a GaN-based power HEMT. The semiconductor chip 4 may include a control electrode 6 and a load electrode 8. In one example, the control electrode 6 may include a gate electrode of the power HEMT, and the load electrode 8 may include at least one of a drain electrode and a source electrode of the power HEMT. A first lead 10 may be electrically coupled to the control electrode 6 and may extend away from the control electrode 6 in a first direction (see left arrow). In addition, a second lead 12 may be electrically coupled to the load electrode 8 and may extend away from the load electrode 8 in a second direction (see right arrow) opposite the first direction. In the example of FIG. 1, the leads 10, 12 are illustrated to be electrically connected to the electrodes 6, 8 via electrically conductive elements indicated by solid lines. In general, these electrically conductive elements may be arbitrary and may, for example, include at least one of a wire and a clip. However, in further examples, other possibilities for electrically connecting the leads 10, 12 and the electrodes 6, 8 may be chosen.

During an operation of the device 100, undesired parasitic effects may occur. For example, a control semiconductor chip, such as e.g., a gate driver circuit (not illustrated), may be electrically coupled to the control electrode 6 of the semiconductor chip 4 via an electrically conductive coupling element, which may include the first lead 10, for control purposes. An electrical current passing through such coupling element may induce a parasitic like inductance L. For an example of a GaN-based power HEMT driven by a gate driver circuit, a value of the inductance L may be much greater than 2 nH, i.e. L>>2 nH. Such value of L may e.g., have an undesired effect on a switching performance of a half bridge including the power HEMT and the gate driver circuit. In particular, the value of L may increase with an increasing length of the coupling element. In the example of FIG. 1, the control lead 10 and the load lead 12 may extend in opposite directions. As will become apparent later on, such directional separation of the control and load leads may reduce a length of the considered coupling element and thus a value of the parasitic inductance L compared to devices including control and load leads of similar direction.

Figure 2:
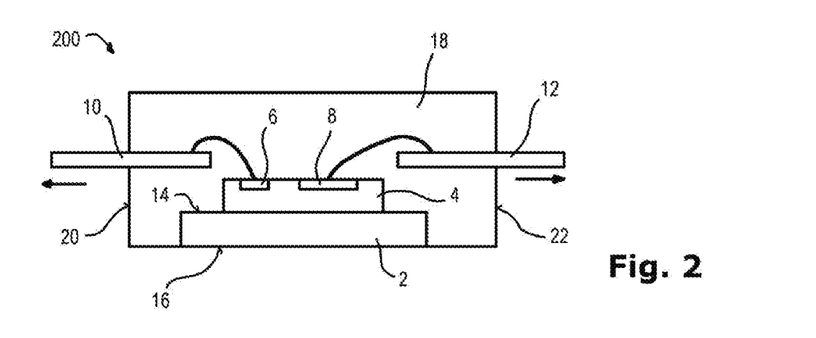
FIG. 2 schematically illustrates a cross-sectional side view of a device 200 in accordance with the disclosure.

FIG. 2 schematically illustrates a cross-sectional side view of a device 200 in accordance with the disclosure. In the example of FIG. 2, the device 200 is illustrated in a general manner and may include further components that are not illustrated for the sake of simplicity. For example, the device 200 may further include one or more components of other devices in accordance with the disclosure.

The device 200 may include a leadframe that may include a diepad 2, a first lead 10 and a second lead 12. In addition, the device 200 may include a semiconductor chip 4 that may be arranged over a first surface 14 of the diepad 2, wherein the semiconductor chip 4 may include a control electrode 6 and a load electrode 8. The device 200 may further include an encapsulation material 18 that may cover the semiconductor chip 4 and the diepad 2. A second surface 16 of the diepad 2 opposite the first surface 14 may be exposed from the encapsulation material 18. The device 200 may further include a first lead 10 that may be electrically coupled to the control electrode 6 and may protrude out of a first surface 20 of the encapsulation material 18 in a first direction (see left arrow). Furthermore, the device 200 may include a second lead 12 that may be electrically coupled to the load electrode 8 and may protrude out of a second surface 22 of the encapsulation material 18 opposite the first surface 20 in a second direction (see right arrow) opposite the first direction. The device 200 may at least partly be similar to the device 100 such that comments made in connection with the device 100 may also hold true for the device 200.

Figure 3:
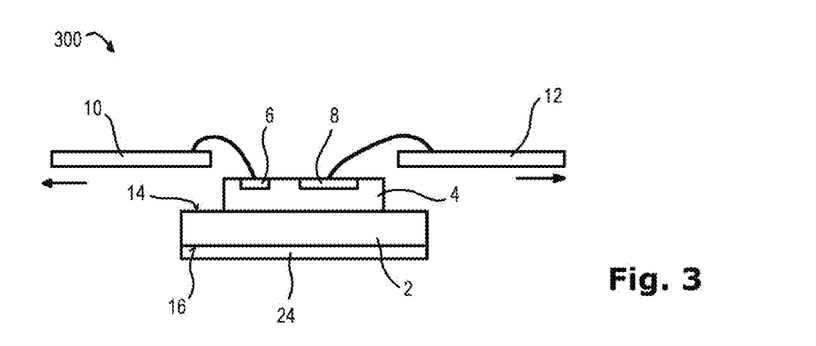
FIG. 3 schematically illustrates a cross-sectional side view of a device 300 in accordance with the disclosure.

FIG. 3 schematically illustrates a cross-sectional side view of a device 300 in accordance with the disclosure. In the example of FIG. 3, the device 300 is illustrated in a general manner and may include further components that are not illustrated for the sake of simplicity. For example, the device 300 may further include one or more components of other devices in accordance with the disclosure.

The device 300 may include a carrier 2 and a semiconductor chip 4 that may be arranged over a first surface 14 of the carrier 2. The semiconductor chip 4 may include a control electrode 6 and a load electrode 8. A first lead 10 may be electrically coupled to the control electrode 6 and may extend away from the control electrode 6 in a first direction (see left arrow). In addition, a second lead 12 may be electrically coupled to the load electrode 8 and may extend away from the load electrode 8 in a second direction (see right arrow) opposite the first direction. The device 300 may further include an insulation layer 24 that may be arranged over a second surface 16 of the carrier 2 opposite the first surface 14.

During an operation of the device 300, undesired parasitic effects may occur. In one example, the device 300 may operate at high frequencies, wherein occurring cross talk may emit electrical high frequency signals through the insulation layer 24. The emitted electrical signals may cause undesired electromagnetic interferences, for example to neighboring electrical components. In one example, a dielectric constant Er of the insulation layer 24 may be chosen such that cross talk and electromagnetic interferences may be reduced. In a further example, heat may be generated during an operation of the device 300. By adjusting a thermal conductivity λ of the insulation layer 24, heat dissipation in a direction away from the semiconductor chip 4 may be supported. The dielectric constant Er and the thermal conductivity λ of the insulation layer 24 may be chosen to satisfy specific conditions. For example, the dielectric constant Er and the thermal conductivity λ of the insulation layer 24 may be chosen to satisfy: $\lambda \cdot \in_r < 4.0 \cdot W \cdot m^{-1} \cdot K^{-1}$.

Figure 4A:
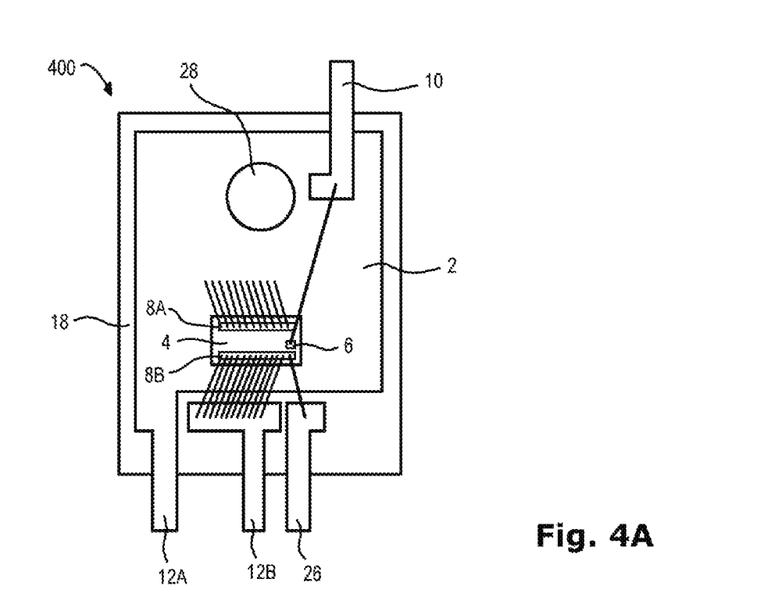
FIG. 4A schematically illustrates a top view of a device 400 in accordance with the disclosure.
Figure 4B:
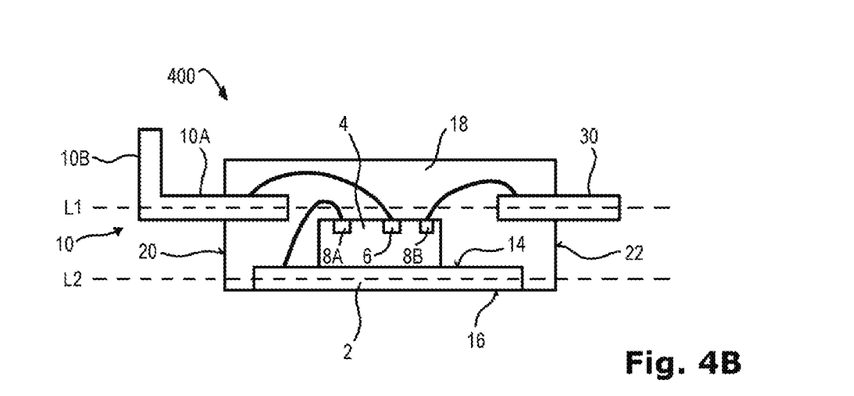
FIG. 4B schematically illustrates a cross-sectional side view of the device 400.

FIG. 4 includes FIGS. 4A and 4B which schematically illustrate views of a device 400 in accordance with the disclosure. In particular, FIG. 4A illustrates a top view of the device 400, and FIG. 4B illustrates a cross-sectional side view of the device 400. Due to the chosen perspectives, FIG. 4A may show components that are not shown by FIG. 4B and vice versa. The device 400 may be seen as a more detailed implementation of the devices 100 to 300 such that details of the device 400 described below may be likewise applied to the devices 100 to 300.

The device 400 may include a semiconductor chip 4 that may be mounted over a diepad 2 of a leadframe. In particular, the semiconductor chip 4 may be based on a compound semiconductor material. In the following, the semiconductor chip 4 may thus be referred to as compound semiconductor chip 4, which is in no way limiting. Corresponding comments may also be valid for other types of semiconductor chips. The device 400 may further include multiple leads 10, 12A, 12B, 26 that may be a part of the leadframe as well. In FIG. 4B, not all of the leads may be visible due to the chosen perspective. Here, the plurality of leads is denoted by a single reference sign 30. The device 400 may further include an encapsulation material 18.

The compound semiconductor chip 4 may include a gate electrode 6, a drain electrode 8A and a source electrode 8B. In the example of FIG. 4, the compound semiconductor chip 4 may correspond to a power HEMT chip, wherein the electrodes 6, 8A, 8B may be arranged over a main surface of the compound semiconductor chip 4 facing away from the diepad 2. The compound semiconductor chip 4 may thus have a lateral structure. The gate electrode 6 may be electrically connected to the first lead 10, the drain electrode 8A may be electrically connected to the second lead 12A and the diepad 2, and the source electrode 8B may be electrically connected to the third lead 12B and the fourth lead 26. The first lead 10 and the plurality of leads 30 may protrude out of the encapsulation material 18 such that electrical connections between the electrodes of the compound semiconductor chip 4 and components arranged outside of the encapsulation material 18 may be established. Since the drain electrode 8A may be electrically connected to the diepad 2 arranged on the bottom side of the compound semiconductor chip 4, the illustrated arrangement may be referred to as drain down arrangement.

The leads and the electrodes of the compound semiconductor chip 4 may be electrically coupled via electrically conductive elements. In the example of FIG. 4, the electrically conductive elements are illustrated by solid lines and may correspond to wires and/or clips. A respective electrical connection between a lead and an electrode may be established by one or more wires in one example. Here, the number of used wires and their thicknesses may depend on the strength of the currents that may pass between the lead and electrode during an operation of the device 400.

In the example of FIG. 4A, 4B, the first lead 10 and the plurality of leads 30 may be arranged on a first level L1 while the diepad 2 may be arranged on a second level L2 that may differ from the first level L1. An exemplary distance between the first level L1 and the second level L2 may lie in a range from about 0.5 millimeter to about 5.0 millimeter. In a further example, the diepad 2 and at least one of the leads 10, 30 may be arranged on a same level. In one example, the diepad 2 and the leads 10, 30 may be part of the same leadframe. In this case, the diepad 2 and the leads 10, 30 may have been formed before or after bending the leadframe in a suitable manner to provide the illustrated levels L1 and L2. The level L1 including the leads 10, 30 may be referred to as wirebond level, and the level L2 including the diepad 2 may be referred to as diepad level.

The diepad 2 may be embedded in the encapsulation material 18. In the example of FIG. 4, the diepad 2 may be exposed from the encapsulation material 18 on its lower surface 16. In particular, the exposed surface 16 of the diepad 2 and the lower surface of the encapsulation material 18 may be flush, i.e. the surfaces may be arranged in a common plane. Due to the flush arrangement of the surfaces, the lower surface 16 of the diepad 2 may contact a heatsink (not illustrated), in particular in a common plane. In one example, the diepad 2 may be in direct contact with the heatsink. In a further example, one or more additional layers may be arranged between the diepad 2 and the heatsink. An additional layer may include thermal grease or an insulation material that may satisfy specific conditions with regard to its material composition, its dielectric constant Er and its thermal conductivity λ. A heat dissipation path may extend from the compound semiconductor chip 4 arranged over the diepad 2 to the heatsink in a direction substantially perpendicular to the mounting surface 14 of the diepad 2.

The diepad 2 may include an enlarged surface for mounting one or more electronic components, for example the compound semiconductor chip 4. In addition, the diepad 2 may include an elongated section that may form the second lead 12A. In this regard, the second lead 12A and the diepad 2 may be formed contiguous as a single piece that may be made of an electrically conductive material. The second lead 12A may protrude out of the encapsulation material 18 such that an electrical coupling between the drain electrode 8A and a component arranged outside of the encapsulation material 18 may be established.

In FIG. 4B, the vertical side surfaces of the diepad 2 may be covered by the encapsulation material 18. In a further example, a part of the diepad 2 may protrude out of the encapsulation material 18 on one of its sides such that at least one of the side surfaces of the diepad 2 may remain uncovered by the encapsulation material 18. The diepad 2 may include a hole 28 that may extend through the diepad 2 between one main surface 14 and another main surface 16 of the diepad 2. In the example of FIG. 4, the hole 28 may additionally protrude through the encapsulation material 18. In a further example, the part of the diepad 2 including the hole 28 may be exposed from the encapsulation material 18. A heatsink may be attached to the diepad 2 by a fixing component, for example a screw, that may extend through the hole 28.

The plurality of leads 30 may protrude out of a side surface 22 of the encapsulation material 18. Here, one or more of the leads 30 may extend in a direction parallel to at least one of the surfaces 14, 16 of the diepad 2. In addition, the side surface 22 of the encapsulation material 18 may be perpendicular to at least one of the surfaces 14, 16 of the diepad 2. The chosen arrangement of the leads 30 may result in different lead pitches of the device 400. For example, a distance between the second lead 12A and the third lead 12B may be greater than a distance between the third lead 12B and the fourth lead 26. The leads 30 protruding out of the side surface 22 of the encapsulation material 18 may be arranged in parallel such that the device 400 may e.g., be arranged over a PCB (not illustrated), in particular a motherboard. A connection between the device 400 and the PCB may particularly be established by at least one of the leads 30.

The first lead 10 may protrude out of a side surface 20 of the encapsulation material 18, wherein the side surface 20 of the encapsulation material 18 may be perpendicular to at least one of the surfaces 14, 16 of the diepad 2. The first lead 10 may include a first section 10A that may extend in a direction parallel to at least one of the surfaces 14, 16 of the diepad 2. The first section 10A of the first lead 10 may be at least partly covered by the encapsulation material 18. In addition, the first lead 10 may include a second section 10B that may extend in a direction perpendicular to at least one of the surfaces 14, 16 of the diepad 2. The second section 10B of the first lead 10 may remain exposed from the encapsulation material 18. The device 400 may be arranged over a PCB (not illustrated), in particular over a daughterboard. A connection between the device 400 and the daughterboard may particularly be established by the perpendicular second section 10B of the first lead 10.

The fourth lead 26 may be configured to provide a sensing signal, wherein the sensing signal may be based on a physical parameter of the compound semiconductor chip 4. For example, the sensing signal may represent at least one of an electrical potential, an electrical current, a temperature, etc. of the device 400, and in particular of the compound semiconductor chip 4. In the example of FIG. 4, the sensing signal may be provided from the source electrode 8B of the compound semiconductor chip 4. In further examples, the sensing signal may also be provided from a different electrode of the compound semiconductor chip 4.

In one example, the compound semiconductor chip 4 may correspond to a power HEMT that may e.g., form a part of a switch of a half bridge circuit. In this connection, the power HEMT 4 may be controlled by a gate driver circuit (not illustrated) which may be a part of the device 400 or may be included in a separate semiconductor package. For example, the gate driver circuit may be mounted on a daughterboard that may be connected to the first lead 10. Furthermore, the device 400 may include additional electronic components that are not illustrated for the sake of simplicity. In one example, the device 400 may include an additional compound power HEMT and an additional gate driver which may form a second switch of the half bridge circuit. In particular, one or more of such additional components may be covered by the encapsulation material 18 and thus be a part of the same semiconductor package.

Figure 5A:
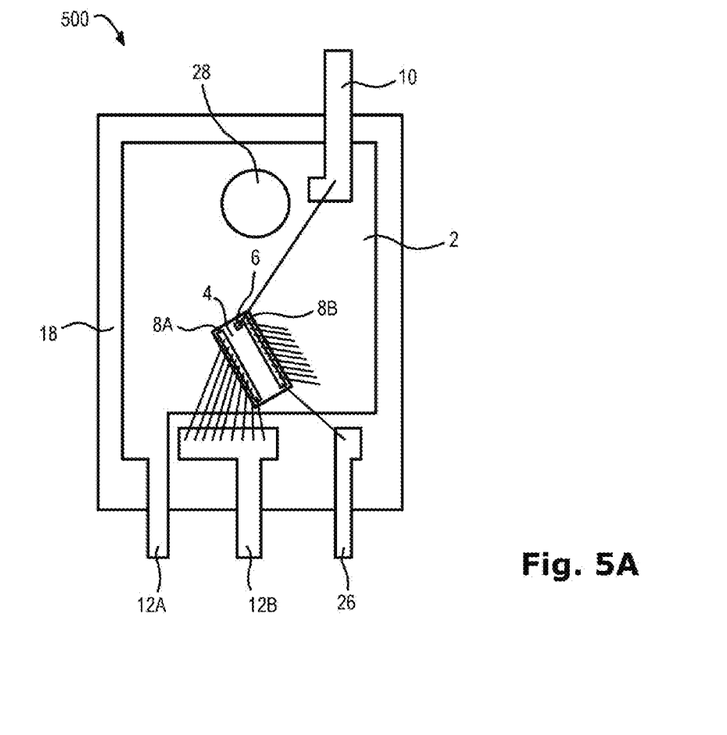
FIG. 5A schematically illustrates a top view of a device 500 in accordance with the disclosure.
Figure 5B:
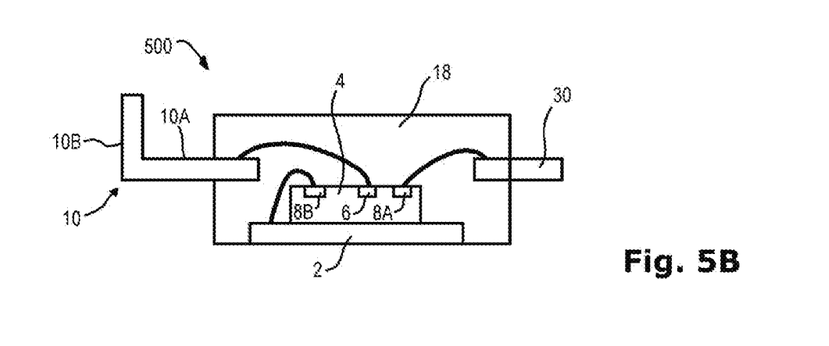
FIG. 5B schematically illustrates a cross-sectional side view of the device 500.

FIG. 5 includes FIGS. 5A and 5B which schematically illustrate views of a device 500 in accordance with the disclosure. In particular, FIG. 5A illustrates a top view of the device 500, and FIG. 5B illustrates a cross-sectional side view of the device 500. Due to the chosen perspectives, FIG. 5A may illustrate components that are not illustrated by FIG. 5B and vice versa. The device 500 may be seen as a more detailed implementation of the devices 100 to 300 such that details of the device 500 may be likewise applied to the devices 100 to 300. In addition, the device 500 may be at least partly similar to the device 400.

The devices 400 and 500 may include a similar circuitry. Similar to the device 400, the compound semiconductor chip 4 of the device 500 may correspond to a lateral power HEMT chip including a gate electrode 6, a drain electrode 8A and a source electrode 8B that may be arranged over a main surface of the compound semiconductor chip 4 facing away from the diepad 2. However, in FIG. 5, the electrical connections between the electrodes of the compound semiconductor chip 4 and the leads protruding out of the encapsulation material 18 may differ from corresponding electrical connections of the device 400. In the example of FIG. 5, using a similar numbering of the leads as in FIG. 4, the gate electrode 6 may be electrically connected to the first lead 10, the drain electrode 8A may be electrically connected to the third lead 12B, and the source electrode 8B may be electrically connected to the second lead 12A, the fourth lead 26 and the diepad 2. Since the source electrode 8B may be electrically connected to the diepad 2 arranged on the bottom side of the compound semiconductor chip 4, the illustrated arrangement may be referred to as source down arrangement. The fourth lead 26 connected to the source electrode 8B may be configured to provide one or more sensing signals from the source electrode 8B.

Figure 6:
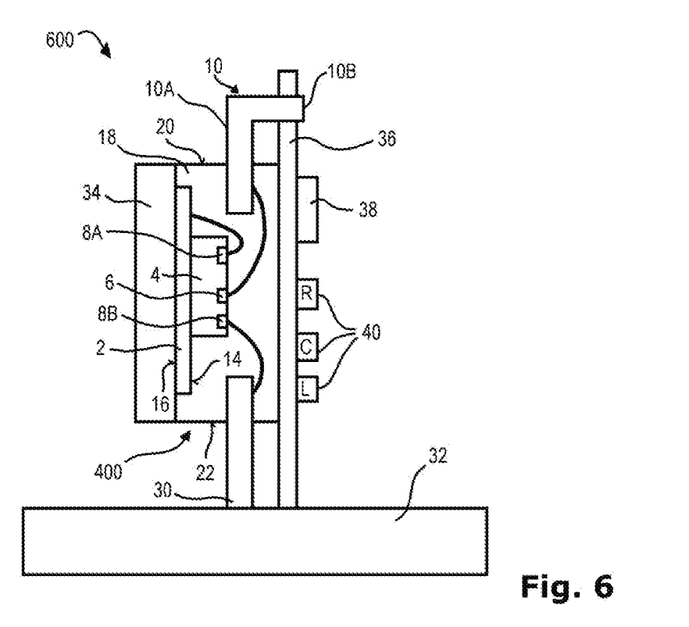
FIG. 6 schematically illustrates a cross-sectional side view of a device 600 in accordance with the disclosure.

FIG. 6 schematically illustrates a cross-sectional side view of a device 600 in accordance with the disclosure. The device 600 can be seen as an extension of the device 400 of FIG. 4. The device 600 may include the device 400 wherein comments made in connection with FIG. 4 may also hold true for FIG. 6. In a further example, the device 600 may alternatively be based on the device 500 of FIG. 5.

The device 600 may include a heatsink 34 that may be attached to the exposed surface 16 of the diepad 2. The heatsink 34 can be seen as a part of the device 600 or not. In one example, additional thermal grease (not illustrated) may be arranged between the exposed surface 16 of the diepad 2 and the heatsink 34. In the example of FIG. 6, the side surfaces of the heatsink 34 are flush with the side surfaces 20, 22 of the encapsulation material 18. In further examples, the heatsink 34 may extend over the encapsulation material 18 on at least one of the side surfaces 20, 22 or vice versa.

The device 400 may be arranged over a PCB 32. The PCB 32 may particularly correspond to a motherboard and may be seen as a part of the device 600 or not. An electrical connection between the device 400 and the motherboard 32 may be established via one or more of the leads 30. For example, a connection between the leads 30 and the motherboard 32 may be realized by a soldering process. In particular, the load leads of the device 400 may be electrically connected to the motherboard 32. Even more particular, the drain electrode 8A and the source electrode 8B of the compound semiconductor chip 4 may be electrically coupled to the motherboard 32 via the leads 12A, 12B.

The device 600 may include a further PCB 36 that may be arranged over a surface of the encapsulation material 18. The PCB 36 may particularly correspond to a daughterboard and may be seen as a part of the device 600 or not. In the example of FIG. 6, the surface of the encapsulation material 18 and the daughterboard 36 may be arranged in a common plane and may be in direct contact with each other. In a further example, the daughterboard 36 may not be in direct contact with the surface of the encapsulation material 18 such that there may remain free space between these components. An electrical connection between the device 400 and the daughterboard 36 may be established via the first lead 10. For example, a connection between the first lead 10 and the daughterboard 36 may be realized by a soldering process. In particular, the control leads of the device 400 may be connected to the daughterboard 36. Even more particular, the gate electrode 6 of the compound semiconductor chip 4 may be electrically coupled to the daughterboard 36 via the first lead 10.

One or more electronic components may be arranged over and may be electrically connected to the daughterboard 36. The electronic components may be covered by an encapsulation material (not illustrated) or not. The number and types of the electronic components may particularly depend on a desired operation of the device 600. In the example of FIG. 6, a control semiconductor chip 38 and exemplary passive components 40 may be arranged over the daughterboard 36. For example, the control semiconductor chip 38 may include a gate driver circuit that may be electrically connected to the gate electrode 6 of the compound semiconductor chip 4. That is, the first lead 10 may be configured to receive a control signal from the control semiconductor chip 38 and forward the control signal to the control electrode 6 of the compound semiconductor chip 4.

The daughterboard 36 may be arranged over and may be electrically connected to the motherboard 32. Hence, an electrical communication between the daughterboard 36 and its components and further electronic components connected to the motherboard 32 may be established as well. In one example, all logic components (e.g., including the control semiconductor chip 38) of the device 600 may be arranged over the daughterboard 36 while all power components (e.g., including the compound semiconductor chip 4) may be included in the device 400.

The following spatial relations between components of the device 600 may occur in the exemplary arrangement of FIG. 6. The surfaces 14, 16 of the carrier 2 may be arranged perpendicular to the motherboard 32 and in parallel to the daughterboard 36. The first section 10A of the first lead 10, i.e. of the control leads (or logic leads) of the device 400, may be arranged perpendicular to the motherboard 32. In addition, the first section 10A of the first lead 10 may be arranged in parallel to the daughterboard 36. The second section 10B of the first lead 10, i.e. of the control leads (or logic leads) of the device 400, may be arranged in parallel to the motherboard 32. In addition, the second section 10B of the first lead 10 may be arranged perpendicular to the daughterboard 36. One or more of the leads 30, i.e. the load leads (or power leads) of the device 400, may be arranged perpendicular to the motherboard 32. In addition, one or more of the leads 30 may be arranged in parallel to the daughterboard 36.

In one example, the device 600 may be configured to operate as a switch of a half bridge circuit. Here, the compound semiconductor chip 4 may include a power HEMT acting as a switch which may be controlled or switched by the control semiconductor chip 38 including a gate driver circuit. For example, the device 600 may include a further compound semiconductor chip (not illustrated) and a further control semiconductor chip (not illustrated) that may form a second switch of the half bridge circuit. Due to the directional separation of the control lead 10 and the load leads 12A, 12B, it may be possible to arrange the control semiconductor chip 38 close to the compound semiconductor chip 4 and, more particular, to reduce a length of the elements coupling these chips. In contrast to this, arrangements including control leads and load leads extending in a similar direction may require increased lengths of relevant coupling elements. In the arrangement of FIG. 6, a parasitic like inductance L induced by an electrical current passing through the coupling elements may thus be reduced. For an example of a power HEMT chip based on GaN and driven by a gate driver circuit, a value of the inductance L may be much greater than 2 nH, i.e. L>>2 nH. An arrangement according to FIG. 6 may e.g., reduce the value of L by an amount of about 5 nH.

Figure 7:
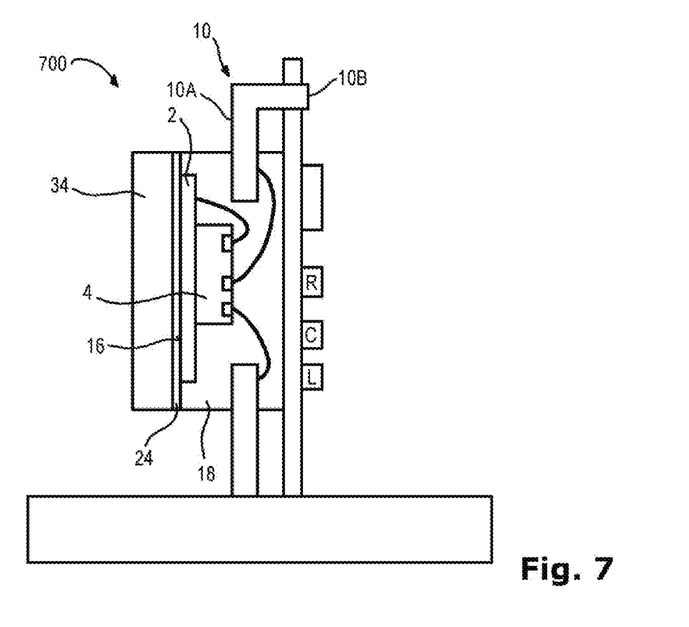
FIG. 7 schematically illustrates a cross-sectional side view of a device 700 in accordance with the disclosure.

FIG. 7 schematically illustrates a cross-sectional side view of a device 700 in accordance with the disclosure. The device 700 can be seen as an extension of the device 600 of FIG. 6, wherein the device 700 may include an additional insulation layer 24 that may be arranged over the exposed surface 16 of the diepad 2. The physical properties and functions of the insulation layer 24 have already been described in foregoing paragraphs.

In one example, a dielectric constant Er and a thermal conductivity λ of the insulation layer 24 may satisfy the condition $\lambda \cdot \varepsilon_r < 4.0 \cdot W \cdot m^{-1} \cdot K^{-1}$. In a further example, the dielectric constant Er of the insulation layer 24 may be smaller than 3.0. In a further example, the insulation layer 24 may include a porous material, wherein a porosity of the porous material may be greater than 50%. In yet a further example, the insulation layer 24 may have a thickness in a range from about 50 micrometer to about 500 micrometer.

Figure 8:
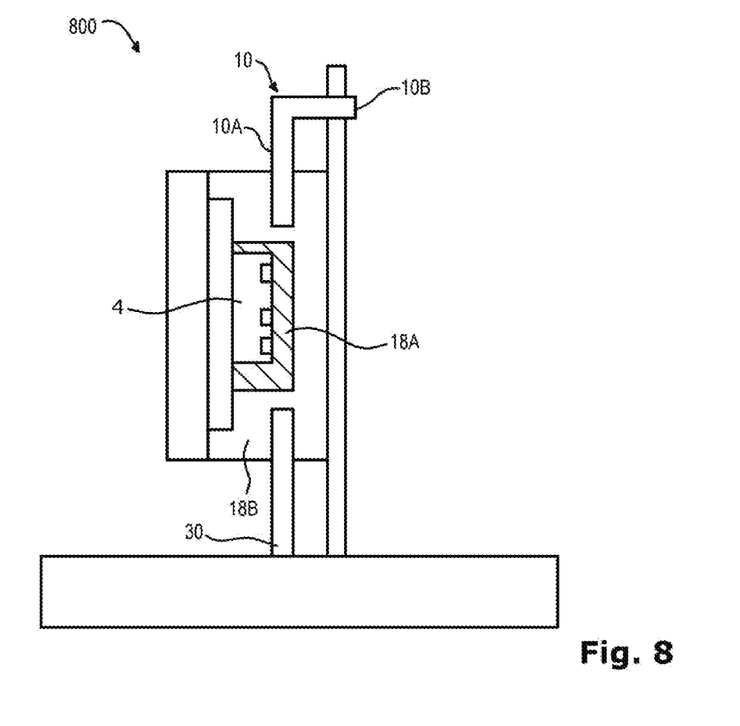
FIG. 8 schematically illustrates a cross-sectional side view of a device 800 in accordance with the disclosure.

FIG. 8 schematically illustrates a cross-sectional side view of a device 800 in accordance with the disclosure. The device 800 can be seen as an extension of the device 600 of FIG. 6. The device 800 may include a first encapsulation material 18A and a second encapsulation material 18B that may differ from the first encapsulation material 18B. The first encapsulation material 18A may at least partly cover the compound semiconductor chip 4. In particular, the first encapsulation material 18A may cover the top side of the compound semiconductor chip 4 and at least one of its side surfaces. In one example, the first encapsulation material 18A may completely surround the top side and all side surfaces of the compound semiconductor chip 4. Wires connected to the electrodes of the compound semiconductor chip 4 may at least partly protrude out of the first encapsulation material 18A.

The second encapsulation material 18B may at least partly cover the first encapsulation material 18A. Here, the second encapsulation material 18B may be formed over the top side and over one or more side surfaces of the compound semiconductor chip 4, wherein the first encapsulation material 18A may be arranged between the second encapsulation material 18B and the compound semiconductor chip 4. In addition, the second encapsulation material 18B may cover at least one of the leads 10 and 30. A thickness of the first encapsulation material 18A may e.g., lie in a range from about 0.1 micrometer to about 0.3 micrometer, or in any of the subranges included in this range. A thickness of the second encapsulation material 18B may e.g., lie in a range from about 1.0 millimeter to about 4.0 millimeter, or in any of the subranges included in this range.

In one example, the first encapsulation material 18A may include at least one of an epoxy and a laminate, and the second encapsulation material 18B may include a thermoplast material. The thermoplast material may include at least one polyethylene, polyvinyl chloride, polystyrene, polyamide, polypropylene. Compared to a sole use of an epoxy and a laminate, the additional application of the thermoplast material may result in lowered manufacturing costs and shorter cycle times.

In a further example, the first encapsulation material 18A may include a laminate, and the second encapsulation material 18B may include an epoxy. Here, the epoxy may provide an improved resistance against humidity compared to the laminate.

In yet a further example, one of the first encapsulation material 18A and the second encapsulation material 18B may include a laminate while the other encapsulation material may include a filled epoxy. Included filler particles may have a diameter in the range from about 10 micrometer to about 100 micrometer. For example, the filled epoxy may provide an increased electromagnetic shielding capability compared to the laminate. Here, the filled epoxy may include filler particles including at least one of Cu, Ni, Fe, Ag, Al, and alloys of said metals. For example, the filled epoxy may provide an increased thermal conductivity compared to the laminate. Here, the filled epoxy may include filler particles including at least one of boron nitride, aluminum nitride, metals. For example, the filled epoxy may provide an increased mechanical hardness compared to the laminate. Here, the filled epoxy may include filler particles including at least one of silicon nitride, silicon oxide.

Figure 9:
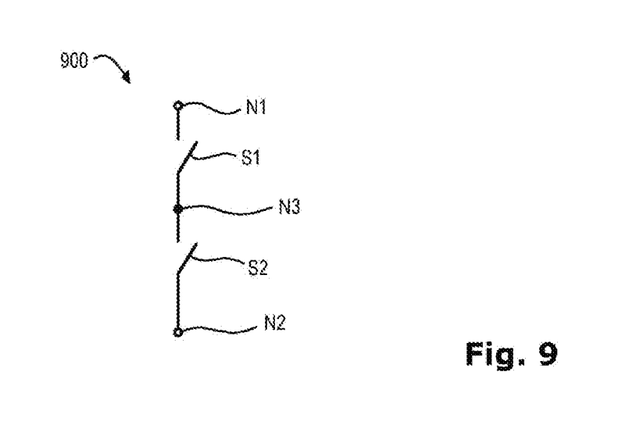
FIG. 9 illustrates a schematic diagram of a half bridge circuit 900.

FIG. 9 illustrates a schematic diagram of a half bridge circuit 900. The half bridge circuit 900 may be arranged between nodes N1 and N2. The half bridge circuit 900 may include switches S1 and S2 connected in series. Constant electrical potentials may be applied to the nodes N1 and N2. For example, a high potential, such as 10, 12, 18, 50, 110, 230, 500 or 1000 V or any other potential, may be applied to the node N1 and a low electrical potential, for example 0 V, may be applied to the node N2. The switches S1 and S2 may be switched at frequencies in the range from 1 kHz to 100 MHz, but the switching frequencies may also be outside this range. This means that a varying electrical potential may be applied to a node N3 arranged between the switches S1 and S2 during an operation of the half bridge. The potential of the node N3 may vary in the range between the low and the high electrical potential.

The half bridge circuit 900 may e.g., be implemented in electronic circuits for converting DC voltages, so-called DC-DC converters. DC-DC converters may be used to convert a DC input voltage provided by a battery or a rechargeable battery into a DC output voltage matched to the demand of electronic circuits connected downstream. DC-DC converters may be embodied as step down converters, in which the output voltage is less than the input voltage, or as step up converters, in which the output voltage is greater than the input voltage. Frequencies of several MHz or higher may be applied to DC-DC converters. Furthermore, currents of up to 100 A or even higher may flow through the DC-DC converters.

The devices in accordance with the disclosure may be configured to operate as a half bridge circuit or at least a part of it. In particular, the devices may be configured to operate as a switch of a half bridge circuit. In a similar fashion, a device in accordance with the disclosure may be configured to operate as at least a part of any other bridge circuit or a cascode circuit.

While a particular feature or aspect of the disclosure may have been disclosed with respect to only one of several implementations, such feature or aspect may be combined with one or more other features or aspects of the other implementations as may be desired and advantageous for any given or particular application. Furthermore, to the extent that the terms "include", "have", "with", or other variants thereof are used in either the detailed description or the claims, such terms are intended to be inclusive in a manner similar to the term "comprise". Also, the term "exemplary" is merely meant as an example, rather than the best or optimal. It is also to be appreciated that features and/or elements depicted herein are illustrated with particular dimensions relative to each other for purposes of simplicity and ease of understanding and that actual dimensions may differ substantially from that illustrated herein.

Although specific aspects have been illustrated and described herein, it will be appreciated by those of ordinary skill in the art that a variety of alternate and/or equivalent implementations may be substituted for the specific aspects shown and described without departing from the concept of the disclosure. This application is intended to cover any adaptations or variations of the specific aspects discussed herein. Therefore, it is intended that this disclosure be limited only by the claims and the equivalents thereof.

What is claimed is:

1. A device, comprising:
   a carrier;
   a semiconductor chip arranged over a first surface of the carrier, wherein the semiconductor chip comprises a control electrode and a load electrode;
   a first lead electrically coupled to the control electrode and extending away from the control electrode in a first direction; and
   one or more second leads electrically coupled to the load electrode, each of the one or more second leads extending away from the load electrode in a second direction opposite the first direction.

2. The device of claim 1, further comprising:
   an encapsulation material covering the carrier, the semiconductor chip, the first lead and each of the one or more second leads.

3. The device of claim 2, wherein a second surface of the carrier opposite the first surface is exposed from the encapsulation material.

4. The device of claim 3, wherein a surface of the encapsulation material and the second surface of the carrier are flush.

5. The device of claim 2, wherein the first lead protrudes out of a first surface of the encapsulation material, and each of the one or more second leads protrudes out of a second surface of the encapsulation material opposite the first surface.

6. The device of claim 5, wherein at least one of the first surface of the encapsulation material and the second surface of the encapsulation material is perpendicular to the first surface of the carrier.

7. The device of claim 2, wherein the encapsulation material comprises a first encapsulation material and a second encapsulation material different from the first encapsulation material, wherein the first encapsulation material covers the semiconductor chip and the second encapsulation material covers the first encapsulation material.

8. The device of claim 1, wherein the first lead comprises a section extending in a direction parallel to the first surface of the carrier.

9. The device of claim 1, wherein the first lead comprises a section extending in a direction perpendicular to the first surface of the carrier.

10. The device of claim 1, wherein the one or more second leads comprise a section extending in a direction parallel to the first surface of the carrier.

11. The device of claim 1, wherein the first lead is configured to receive a control signal from a control semiconductor chip.

12. The device of claim 11, wherein the semiconductor chip comprises a power transistor, and the control semiconductor chip comprises a gate driver circuit configured to drive a gate electrode of the power transistor.

13. The device of claim 1, further comprising:
    an insulation layer arranged over a surface of the carrier opposite the first surface of the carrier.

14. The device of claim 13, wherein a dielectric constant $\in_r$ and a thermal conductivity $\lambda$ of the insulation layer satisfies the condition $\lambda \cdot \in_r < 4.0 \cdot W \cdot m^{-1} \cdot K^{-1}$.

15. The device of claim 13, wherein the dielectric constant $\in_r$ of the insulation layer is smaller than 3.0.

16. The device of claim 13, wherein the insulation layer comprises a porous material, wherein a porosity of the porous material is greater than 50%.

17. The device of claim 13, wherein the insulation layer has a thickness in a range from 50 micrometer to 500 micrometer.

18. The device of claim 1, further comprising:
    a third lead electrically coupled to an electrode of the semiconductor chip, wherein the third lead is configured to provide a sensing signal from the electrode, wherein the sensing signal is based on at least one of an electrical potential of the semiconductor chip, an electrical current of the semiconductor chip, and a temperature of the semiconductor chip.

19. The device of claim 1, wherein the second lead is configured to be electrically coupled to a motherboard, and the first lead is configured to be electrically coupled to a daughterboard.

20. The device of claim 19, wherein a mounting surface of the motherboard is perpendicular to a mounting surface of the daughterboard.

21. The device of claim 19, wherein the daughterboard is mounted over a surface of the encapsulation material.

22. The device of claim 1, wherein the carrier, the first lead and the second lead are part of a leadframe.

23. The device of claim 1, wherein the semiconductor chip is a compound semiconductor chip.

24. The device of claim 1, wherein the semiconductor chip comprises a GaN-based power HEMT.

25. A device, comprising:
    a leadframe comprising a diepad, a first lead and a second lead;
    a semiconductor chip arranged over a first surface of the diepad, wherein the semiconductor chip comprises a control electrode and a load electrode;

an encapsulation material covering the semiconductor chip and the diepad, wherein a second surface of the diepad opposite the first surface of the diepad is exposed from the encapsulation material;

a first lead electrically coupled to the control electrode and protruding out of a first surface of the encapsulation material; and a plurality of second leads electrically coupled to the load electrode, each of the second leads protruding out of a second surface of the encapsulation material opposite the first surface of the encapsulation material.

26. A device, comprising:

a carrier;

a semiconductor chip arranged over a first surface of the carrier, wherein the semiconductor chip comprises a gate electrode, a source electrode, and a drain electrode;

a control lead electrically coupled to the control electrode and extending away from the control electrode in a first direction;

a plurality of source leads electrically coupled to the source electrode and extending away from the source electrode in a second direction opposite the first direction;

a plurality of drain leads electrically coupled to the drain electrode and extending in the second direction, such that all source and drain leads extend in the second direction; and an insulation layer arranged over a second surface of the carrier opposite the first surface.

* * * * *